US012585107B2

(12) United States Patent
Boni et al.

(10) Patent No.: US 12,585,107 B2
(45) Date of Patent: Mar. 24, 2026

(54) MICROELECTROMECHANICAL MIRROR DEVICE WITH PIEZOELECTRIC ACTUATION AND OPTIMIZED SIZE

(71) Applicant: STMicroelectronics S.r.l., Agrate Brianza (IT)

(72) Inventors: Nicolo' Boni, Mountain View, CA (US); Roberto Carminati, Piancogno (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 364 days.

(21) Appl. No.: 18/208,464

(22) Filed: Jun. 12, 2023

(65) Prior Publication Data

US 2023/0408808 A1 Dec. 21, 2023

(30) Foreign Application Priority Data

Jun. 17, 2022 (IT) ......................... 102022000012884

(51) Int. Cl.
G02B 26/08 (2006.01)
B81B 3/00 (2006.01)
G02B 26/10 (2006.01)

(52) U.S. Cl.
CPC ........ G02B 26/0858 (2013.01); B81B 3/0062 (2013.01); G02B 26/101 (2013.01); B81B 2201/042 (2013.01)

(58) Field of Classification Search
CPC .............. G02B 26/0858; G02B 26/101; B81B 3/0062; B81B 2201/042
See application file for complete search history.

(56) References Cited

U.S. PATENT DOCUMENTS

2010/0296147 A1 11/2010 Terada et al.
2012/0092738 A1* 4/2012 Brown ................. G02B 26/101
359/201.1

(Continued)

FOREIGN PATENT DOCUMENTS

CN 111320129 A 6/2020
CN 112740094 A 4/2021

(Continued)

OTHER PUBLICATIONS

IT Search Report and Written Opinion for priority application, IT Appl. No. 102022000012884, report dated Jan. 31, 2023, 8 pgs.

(Continued)

*Primary Examiner* — Euncha P Cherry
(74) *Attorney, Agent, or Firm* — Crowe & Dunlevy LLC

(57) ABSTRACT

A microelectromechanical device has a first tiltable mirror structure extending in a horizontal plane defined by first and second horizontal axes and includes a fixed structure defining a frame delimiting a cavity, a tiltable element carrying a reflecting region, elastically suspended above the cavity having first and second median axes of symmetry, elastically coupled to the frame by first and second coupling structures on opposite sides of the second horizontal axis. The first tiltable mirror structure has a driving structure coupled to the tiltable element to cause rotation around the first horizontal axis. The first tiltable mirror structure is asymmetrical with respect to the second horizontal axis and has, along the first horizontal axis, a first extension on a first side of the second horizontal axis, and a second extension greater than the first extension, on a second side of the second horizontal axis opposite to the first side.

25 Claims, 8 Drawing Sheets

(56)                  References Cited

U.S. PATENT DOCUMENTS

2013/0083379 A1* 4/2013 Tanaka ............... G02B 26/0858
                                          359/200.8
2014/0313558 A1   10/2014 Davis et al.
2020/0326532 A1   10/2020 Baran et al.
2021/0356733 A1   11/2021 Baran et al.

FOREIGN PATENT DOCUMENTS

CN       113009760 A     6/2021
CN       221239140 U     6/2024
EP        2980626 A1     7/2015
JP      2016033651 A     3/2016

OTHER PUBLICATIONS

CN First Office Action and Search Report for counterpart CN Appl.
No. 202310717188.0, report dated Oct. 16, 2025, 10 pgs.

* cited by examiner

MICROELECTROMECHANICAL MIRROR DEVICE WITH PIEZOELECTRIC ACTUATION AND OPTIMIZED SIZE

PRIORITY CLAIM

This application claims the priority benefit of Italian application for Patent No. 102022000012884 filed on Jun. 17, 2022, the content of which is hereby incorporated by reference in its entirety to the maximum extent allowable by law.

TECHNICAL FIELD

This disclosure relates to a microelectromechanical mirror device (made using MEMS—Micro-Electro-Mechanical System—technology) having an optimized size.

BACKGROUND

Microelectromechanical mirror devices are used in portable apparatuses, such as for example smartphones, tablets, notebooks, PDAs, for optical applications, in particular to direct light radiation beams generated by a light source (for example a laser) with desired patterns. Owing to their small size, these devices allow stringent requirements regarding space occupation, in terms of area and thickness, to be compiled with.

For example, microelectromechanical mirror devices are used in optoelectronic apparatuses, such as miniaturized projectors (so-called picoprojectors), capable of projecting images from a distance and generating desired light patterns, for example for augmented or virtual reality applications.

Microelectromechanical mirror devices generally include a tiltable structure carrying a suitable reflecting (or mirror) surface, elastically supported above a cavity and made from a body of semiconductor material so as to be movable, for example with tilt or rotation movement out of a corresponding main extension plane, to direct an impinging light beam in a desired manner.

In particular, in the case of microelectromechanical mirror devices with biaxial projection, a deflection of the light beam along two axes is required, which may be provided by two uniaxial tiltable structures.

In this regard, FIG. 1 schematically shows a picoprojector 1 comprising a light source 2, for example a laser source, generating a light beam which is deflected by a microelectromechanical mirror device 3 towards a screen 4.

In the example schematically shown in the aforementioned FIG. 1, the microelectromechanical mirror device 3 comprises: a first tiltable mirror structure 3a, of a uniaxial type, controlled so that it rotates around a rotation axis A with resonance movement, to generate a fast horizontal scan; and a second tiltable mirror structure 3b, also of a uniaxial type, controlled so that it rotates around a respective rotation axis A' with linear or quasi-static movement (i.e., at a frequency much lower than the frequency of the resonance movement), to generate a slow vertical scan, for example of a sawtooth type. The aforementioned respective rotation axis A' is transverse, for example orthogonal or inclined by a certain non-zero angle with respect to the rotation axis A.

The first and the second tiltable mirror structures 3a, 3b cooperate to generate, on the screen 4, a scanning pattern, which is schematically shown and indicated by 5 in the same FIG. 1. In particular, the first tiltable mirror structure 3a, rotating around the rotation axis A, "draws" a horizontal line on the second tiltable mirror structure 3b; and the same second tiltable mirror structure 3b, rotating around the respective rotation axis A', directs the projection onto a desired rectangular surface on the screen 4.

The rotation of the tiltable mirror structures 3a, 3b is controlled by a respective actuation system which may be for example of electrostatic, electromagnetic or piezoelectric type.

Electrostatic actuation systems generally have the disadvantage of requiring high operating voltages, while electromagnetic actuation systems generally entail a high power consumption; it has therefore been proposed to control the movement of the tiltable mirror structure with piezoelectric actuation.

Microelectromechanical mirror devices with piezoelectric actuation have the advantage of requiring reduced actuation voltages and power consumption with respect to devices with electrostatic or electromagnetic actuation. Furthermore, piezoresistive (PZR) sensor elements for sensing the driving condition of the mirror (in terms of the applied stress or the displacement or position assumed) and for providing a feedback signal to allow a feedback control of the same driving, may be easily provided.

A general request is to reduce the size of the tiltable mirror structures for the aforementioned microelectromechanical mirror devices, in order to obtain a reduced overall area occupation. For example, this need is particularly felt when the mirror devices are used in glasses or headsets for virtual reality or augmented reality applications.

In the case of microelectromechanical mirror devices with biaxial projection, size reduction entails not only a reduction in the size of the single tiltable mirror structures, but also a suitable mutual arrangement of the same structures in order to generally optimize the occupied volume.

In this regard, FIG. 2 schematically shows a microelectromechanical mirror device with biaxial projection, denoted again by 3, with a possible arrangement of the corresponding first and second tiltable mirror structures 3a, 3b, placed in a close position in order to reduce the occupied volume.

A problem that may occur with a similar configuration of the microelectromechanical mirror device 3 is represented by the possibility that the output light beam (OUT) reflected by the second tiltable mirror structure 3b is intercepted, even if partially, by the bulk of the first tiltable mirror structure 3a, creating a clipping of the light projection.

There is accordingly a need in the art to provide a microelectromechanical mirror device which allows the previously highlighted problems to be overcome and which has a reduced area occupation, having optimized size.

SUMMARY

Disclosed herein is an electronic device including a microelectromechanical mirror device with a first tiltable mirror structure in a first die of semiconductor material, extending in a horizontal plane defined by first and second horizontal axes. The first tiltable mirror structure features a fixed structure that defines a frame delimiting a cavity, a tiltable element carrying a reflecting region elastically suspended above the cavity with first and second median axes of symmetry parallel to the first and second horizontal axes, and a driving structure coupled to the tiltable element for rotation around the first horizontal axis with a resonance movement. The first tiltable mirror structure is asymmetrical with respect to the second horizontal axis and has different extension dimensions along the first horizontal axis on opposing sides of the second horizontal axis.

The electronic device includes a first coupling structure on the first side of the second horizontal axis with a single torsional spring connected to the tiltable element and the frame, extending linearly along the first horizontal axis. The second coupling structure features first and second torsional springs, a constraint element between the springs, with the springs connected to the tiltable element, constraint element, and frame along the first horizontal axis.

The single torsional spring of the first coupling structure has a first width along the second horizontal axis, smaller than a corresponding second width of the first torsional spring of the second coupling structure.

The single torsional spring of the first coupling structure has a first torsional stiffness, and the first torsional spring of the second coupling structure has a second torsional stiffness, with a ratio between the first and second torsional stiffnesses lying between 0.55 and 0.65.

The driving structure is entirely positioned on the second side of the second horizontal axis, on the same side as the second coupling structure.

The driving structure includes a single pair of driving arms coupled to the tiltable element, formed by first and second driving arms arranged symmetrically with respect to the first horizontal axis and the second coupling structure. The first and second driving arms are integrally coupled to the frame of the fixed structure, suspended above the cavity, and carry respective piezoelectric structures on their top surfaces, opposite to the cavity.

The driving structure also features first and second displacement transfer structures arranged symmetrically with respect to the first horizontal axis and interposed between the second end of the first and second driving arms and respective end portions of the constraint element of the second coupling structure. Each displacement transfer structure is configured to convey driving of the first or second driving arm to the respective end portion of the constraint element.

Each of the first and second displacement transfer structures includes a first arm extending linearly along the first horizontal axis and coupled between the second end of a corresponding driving arm and a rigid connecting element near the tiltable element, and a second arm extending linearly along the first horizontal axis, parallel to the first arm, and coupled between the rigid connecting element, near the tiltable element, and the respective end portion of the constraint element of the second coupling structure.

The second end of the single torsional spring of the first coupling structure is connected to the frame by first and second coupling elastic elements, extending parallel to the second horizontal axis, transversely to the single torsional spring, from the second end towards a respective long side of the frame.

The second end of the single torsional spring of the first coupling structure is connected to the frame by first and second coupling elastic elements, which are of a folded type and have a general extension along the first horizontal axis, connecting the second end of the single torsional spring to a first short side of the frame.

The electronic device has first and second coupling elastic elements and part of the single torsional spring extending inside a recess provided in the frame at the first short side.

A reinforcement structure is coupled below the tiltable element of the first tiltable mirror structure as a mechanical reinforcement for the tiltable element.

The device also includes a second tiltable mirror structure with a tiltable element that rotates around a rotation axis with linear or quasi-static movement. The second tiltable mirror structure cooperates with the first tiltable mirror structure's tiltable element to direct an impinging light beam. The second tiltable mirror structure is provided in a second die of semiconductor material with a fixed structure defining a frame that delimits a cavity housing the tiltable element. The frame defines an outer side surface of the second die with a concavely patterned shape, forming a recess that accommodates at least part of the first die of the first tiltable mirror structure.

The second tiltable mirror structure is arranged with its horizontal plane at a certain angle, less than 90°, relative to the horizontal plane of the first tiltable mirror structure.

The recess has a basin shape and is delimited by a base portion extending parallel to the first horizontal axis and by wall portions, inclined or orthogonal, with respect to the base portion.

The second tiltable mirror structure further includes an actuation structure, coupled to the tiltable element and configured to cause it to rotate around the rotation axis. The actuation structure features first and second pairs of driving arms, each formed by first and second driving arms, arranged symmetrically with respect to the rotation axis. Each driving arm has a first end integrally coupled to the frame and a second end elastically coupled to the tiltable element by a respective decoupling elastic element. The outer side surface is arranged in a close position, with a reduced separation gap, with respect to the driving arms and the tiltable element throughout the entire extension along the first horizontal axis.

The electronic device is an optoelectronic device that includes a light source for generating a light beam. The microelectromechanical mirror device acts as a mirror module with biaxial projection for receiving the light beam and directing it towards an external screen or display surface placed at a distance from the optoelectronic device.

BRIEF DESCRIPTION OF THE DRAWINGS

For a better understanding, preferred embodiments are now described, purely by way of non-limiting example, with reference to the attached drawings, wherein.

DETAILED DESCRIPTION

Figure 1:
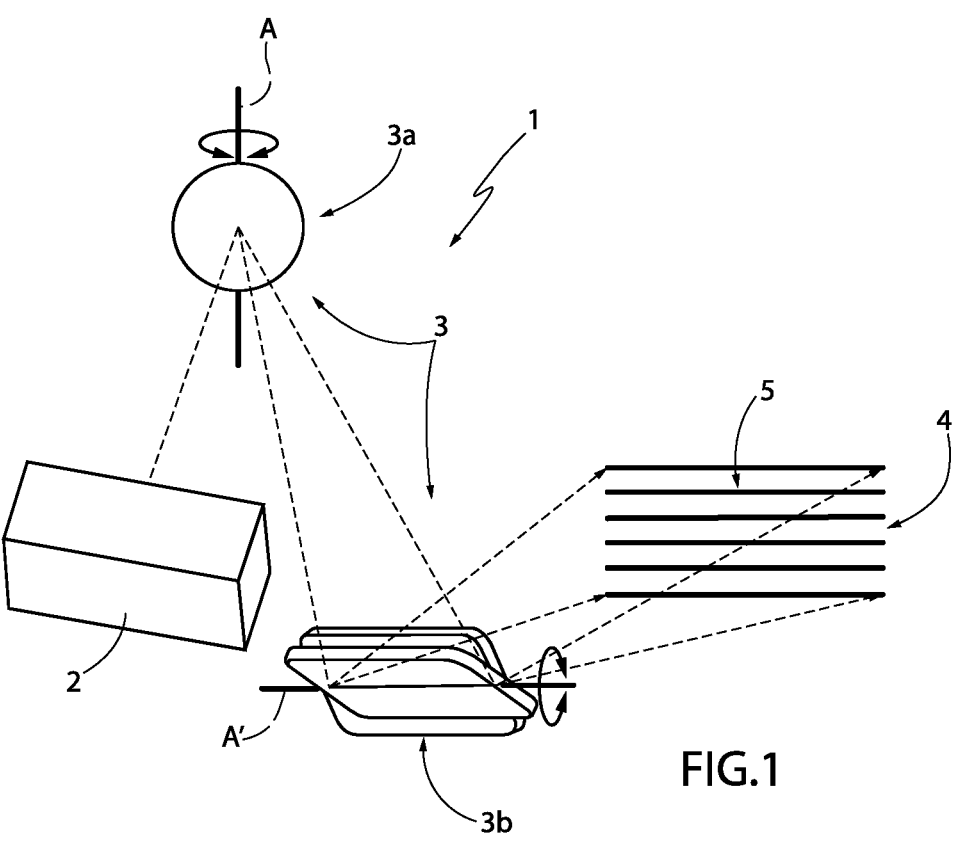
FIG. 1 schematically shows a prior art picoprojector provided by a pair of tiltable mirror structures.
Figure 3:
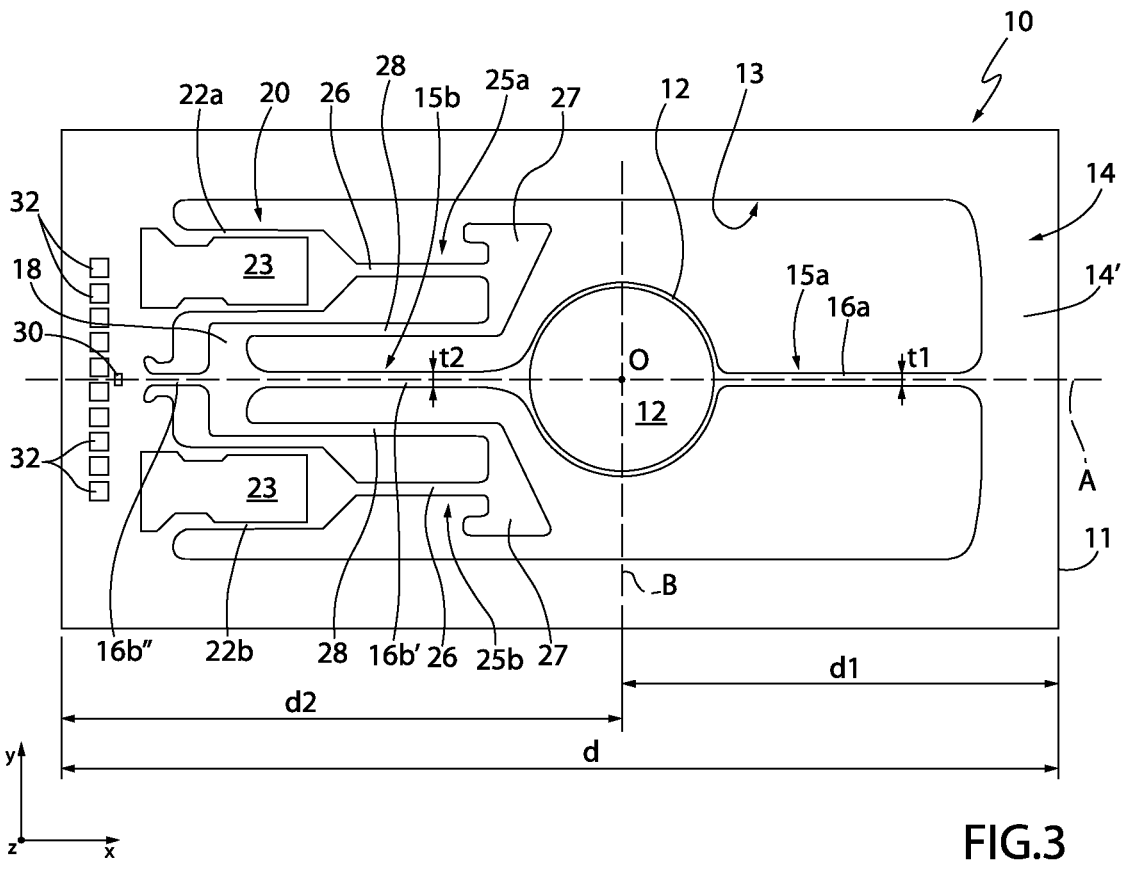
FIG. 3 shows a schematic plan view of a tiltable mirror structure of the microelectromechanical mirror device, having a resonance movement, according to an aspect of this disclosure.

FIG. 3 illustrates a tiltable mirror structure, based on MEMS technology, generally denoted by 10; this tiltable mirror structure 10 is designed to provide a resonance fast scanning movement (thus corresponding, for example, to the first tiltable mirror structure 3a of the aforementioned microelectromechanical mirror device 3 of the picoprojector 1 of FIG. 1).

As will be described in detail below, according to an aspect of this disclosure, the tiltable mirror structure 10 has an asymmetrical configuration along a main extension axis thereof, in order to obtain a size reduction along the same main extension axis.

The tiltable mirror structure 10 is formed in a die 11 of semiconductor material, in particular silicon, and has a tiltable element 12, having (at rest) a main extension in a horizontal plane xy and being arranged so that it rotates with fast movement, in resonance, around a first axis A, parallel to a first horizontal axis x of the aforementioned horizontal plane xy (this first horizontal axis x represents in this case the aforementioned main extension axis of the tiltable mirror structure 10).

The first axis A represents a median axis of symmetry for the tiltable element 12 and in general for the tiltable mirror structure 10.

A second axis B, orthogonal to the aforementioned first axis A and intersecting the same first axis A at a geometric center O of the tiltable element 12 in the horizontal plane xy, represents a further median axis of symmetry for the same tiltable element 12. This second axis B is parallel to a second horizontal axis y, orthogonal to the first horizontal axis x and defining, with the same first horizontal axis x, the horizontal plane xy.

As previously indicated, and as will be described in detail below, according to an aspect of this disclosure, the tiltable mirror structure 10 is generally asymmetrical with respect to this second axis B (and with respect to the second horizontal axis y) and has, along the first horizontal axis x: a first extension dimension d1, on a first side of the aforementioned second axis B; and a second extension dimension d2, greater with respect to the first extension dimension d1, on a second side of the aforementioned axis B, opposite to the first side (a total extension of the tiltable mirror structure 10 along the same first horizontal axis x being indicated by d, where d=d1+d2).

Purely by way of example, the aforementioned first extension dimension d1 may be equal to 3.5 mm and the aforementioned second extension dimension d2 may be equal to 4.5 mm (with the total extension d equal to 8 mm); in general, the first extension dimension d1 may be in the example comprised between 3 mm and 4.5 mm (the lower limit being related to a mechanical stress limit bearable by elastic elements).

The aforementioned tiltable element 12 is suspended above a cavity 13, provided in the die 11 and defines a supporting element, which carries a reflecting region 12' (for example of aluminum, or gold, depending on whether the projection is in the visible or in the infrared region), so as to define a mirror element.

The tiltable element 12 is elastically coupled to a fixed structure 14, formed in the same die 11 and defining, in the horizontal plane xy, a frame 14'; this frame 14' has a generally rectangular shape in the aforementioned horizontal plane xy and delimits and surrounds the aforementioned cavity 13.

In particular, the tiltable element 12 is elastically coupled to the frame 14' by first and second coupling structures 15a, 15b, which extend longitudinally along the first horizontal axis x, suspended above the cavity 13, between the frame 14' and the tiltable element 12, on opposite sides of the same tiltable element 12 with respect to the second axis B.

In detail, the first coupling structure 15a, arranged on the aforementioned first side of the second axis B, is in this case formed by a single torsional spring 16a, having a first end coupled to the tiltable element 12 and a second end coupled to the frame 14' (in particular to a corresponding first short side). In the illustrated embodiment, this torsional spring 16a has a linear-beam shape with extension along the first horizontal axis x.

The second coupling structure 15b, conversely, comprises a first torsional spring 16b' and a second torsional spring 16b", having a linear-beam shape with extension along the first horizontal axis x, and a constraint element 18, interposed between the aforementioned first and second torsional springs 16b', 16b".

In detail, the first torsional spring 16b' has a first end coupled to the tiltable element 12 and a second end coupled to the constraint element 18. The second torsional spring 16b" has a first end coupled to the constraint element 18 (on an opposite side with respect to the first torsional spring 16b' along the first horizontal axis x) and a second end coupled to the frame 14' (in particular to a corresponding second short side, opposite to the aforementioned first short side); the second torsional spring 16b" has a length along the first horizontal axis x that is smaller, in particular much smaller, than a corresponding length of the first torsional spring 16b'.

In general, the aforementioned torsional springs 16a, 16b', 16b" have high stiffness to bending along the first and the second horizontal axes x, y of the horizontal plane xy and are yielding to torsion around the axis A, so as to allow the rotation of the tiltable element 12.

The aforementioned constraint element 18 is stiff and in the example has a generally rectangular shape in the horizontal plane xy with a width (in a direction parallel to the second horizontal axis y) much greater with respect to the torsional springs 16b', 16b" and a length (in a direction parallel to the first horizontal axis x) comparable, in the example, to that of the second torsional spring 16b". The same constraint element 18 traverses the first axis A, having first and second end portions along the second horizontal axis y arranged on opposite sides of the same first axis A.

The tiltable mirror structure 10 further comprises a driving structure 20, coupled to the tiltable element 12 and configured so as to cause it to rotate around the first axis A; this driving structure 20 is entirely arranged on the aforementioned second side of the second axis B, that is on the same side as the second coupling structure 15b.

According to an aspect of this disclosure, the tiltable mirror structure 10 does not include driving structure arranged on the aforementioned first side of the second axis B, which is on the same side as the first coupling structure 15*a*.

In detail, the aforementioned driving structure 20 comprises a single pair of driving arms formed by first and second driving arms 22*a*, 22*b*, arranged on opposites side of, and symmetrically with respect to, the first axis A and the second coupling structure 15*b*, and having a longitudinal extension parallel to the first horizontal axis x.

In the embodiment illustrated in FIG. 1, the driving arms 22*a*, 22*b* have a generically rectangular shape with a first end integrally coupled to the frame 14' of the fixed structure 14, are suspended above the cavity 13 and carry, at a respective top surface (opposite to the same cavity 13) a respective piezoelectric structure 23 (in particular including PZT—Lead Zirconate Titanate), having for example substantially the same extension in the horizontal plane xy with respect to the corresponding driving arm 22*a*, 22*b*.

This piezoelectric structure 23 (in a manner not illustrated in detail) is formed by superimposing a bottom electrode region, of a suitable conductive material, arranged above the corresponding driving arm 22*a*, 22*b*; a region of piezoelectric material (for example formed by a PZT thin film) arranged on the aforementioned bottom electrode region; and a top electrode region arranged on the piezoelectric material region.

The aforementioned driving structure 20 further comprises first and second displacement transfer structures 25*a*, 25*b*, arranged symmetrically to each other with respect to the first axis A and interposed between a second end of the first, respectively, the second driving arm 22*a*, 22*b* and a respective end portion of the constraint element 18 of the second coupling structure 15*b*.

Each of the first and second displacement transfer structures 25*a*, 25*b* comprises a first arm 26, having linear extension along the first horizontal axis x and coupled between the second end of the corresponding driving arm 22*a*, 22*b* and a rigid connecting element 27, arranged in proximity to the tiltable element 12; and a second arm 28, also having linear extension along the first horizontal axis x, parallel to the first arm 26 and coupled between the same rigid connecting element 27, in proximity to the tiltable element 12, and the first, or second, end portion of the constraint element 18 of the coupling structure 15*b*. This second arm 28 is therefore interposed between the first torsional spring 16*b'* of the second coupling structure 15*b* and the aforementioned first arm 26.

The tiltable mirror structure 10 further comprises a piezoresistive (PZR) sensor 30, suitably arranged so that it provides a sensing signal associated with the rotation of the tiltable element 12 around the first axis A; this sensing signal may be provided outside the microelectromechanical mirror device 1 to implement a feedback control for driving of the same tiltable element 12.

In the embodiment illustrated in FIG. 3, this piezoresistive sensor 30 is provided (for example by surface diffusion of doping atoms) in the frame 14', at the region of coupling of the same frame 14' to the second torsional spring 16*b"* of the second coupling structure 15*b*. This piezoresistive sensor 30 is arranged so that it senses the stress associated with the torsion of the aforementioned second torsional spring 16*b"* and therefore provides an indication relating to the rotation movement of the tiltable element 12.

The tiltable mirror structure 10 further comprises a plurality of electrical contact pads 32, carried by the fixed structure 14 at the frame 14', electrically connected (in a manner not illustrated in detail in the same FIG. 3) to the piezoelectric structures 23 of the driving arms 22*a*, 22*b* by respective electrical connection tracks, to allow the electrical biasing thereof by electrical signals coming from outside of the microelectromechanical mirror device 1 (for example provided by a biasing device of an electronic apparatus wherein the tiltable mirror structure 10 is integrated). The aforementioned electrical contact pads 32 are also connected to the piezoresistive sensor 30, to output the aforementioned sensing signal.

Figure 4:
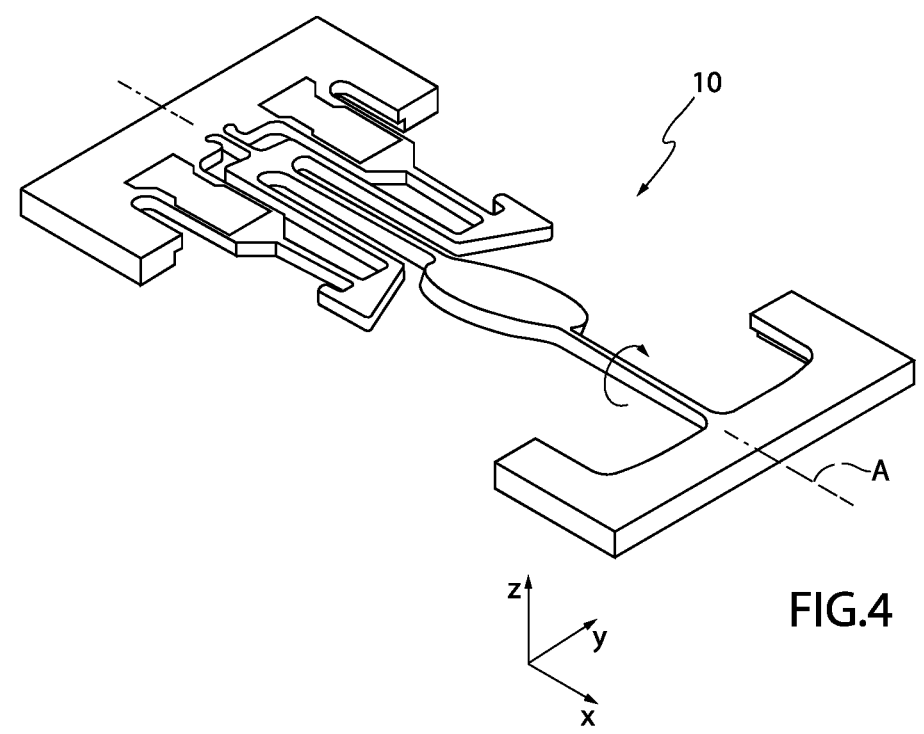
FIG. 4 shows the tiltable mirror structure of FIG. 3, during a corresponding rotation movement.

During operation of the tiltable mirror structure 10, as schematically illustrated in FIG. 4, the application of a biasing voltage to the piezoelectric structure 23 of the first driving arm 22*a* (having a positive value with respect to the biasing of the piezoelectric structure 23 of the second driving arm 22*b*, which may for example be connected to a ground reference potential), may cause a rotation of a positive angle around the first axis A.

Correspondingly, the application of a biasing voltage to the piezoelectric structure 23 of the second driving arm 22*b* (having a positive value with respect to the bias of the piezoelectric structure 23 of the first driving arm 22*a*, which may for example in this case be connected to a ground reference potential), may cause a corresponding rotation of a negative angle around the same first axis A.

In particular, driving of the first driving arm 22*a* in a first direction along the orthogonal axis z (for example downwards, as illustrated in the aforementioned FIG. 4) is conveyed to the first end portion of the constraint element 18 by the first displacement transfer structure 25*a*; similarly, the driving of the second driving arm 22*a* in a second direction (for example downwards) of the same orthogonal axis z is conveyed to the second end portion of the constraint element 18 by the second displacement transfer structure 25*b*, thereby causing torsion of the first torsional spring 16*b'* and the consequent rotation of the tiltable element 12.

In greater detail, according to an aspect of this disclosure, the torsional spring 16*a* of the first coupling structure 15*a* has a first width t1 along the second horizontal axis y, which is smaller with respect to a corresponding second width t2 of the first torsional spring 16*b'* of the second coupling structure 15*b*.

In particular, the torsional spring 16*a* has a torsional stiffness k1 even 40% lower with respect to a corresponding torsional stiffness k2 of the first torsional spring 16*b'*; in the embodiment illustrated in FIG. 3, this different torsional stiffness is mainly due to the different width, since the length of the aforementioned torsional springs is substantially the same (in order to maintain a similar stress distribution).

In general, the ratio between the aforementioned torsional stiffnesses (k1/k2) is preferably comprised between 0.55 and 0.65; in other words, the torsional stiffness k1 of the single torsional spring 16*a* is comprised between 55% and 65% of the torsional stiffness k2 of the first torsional spring 16*b'*.

Figure 5A:
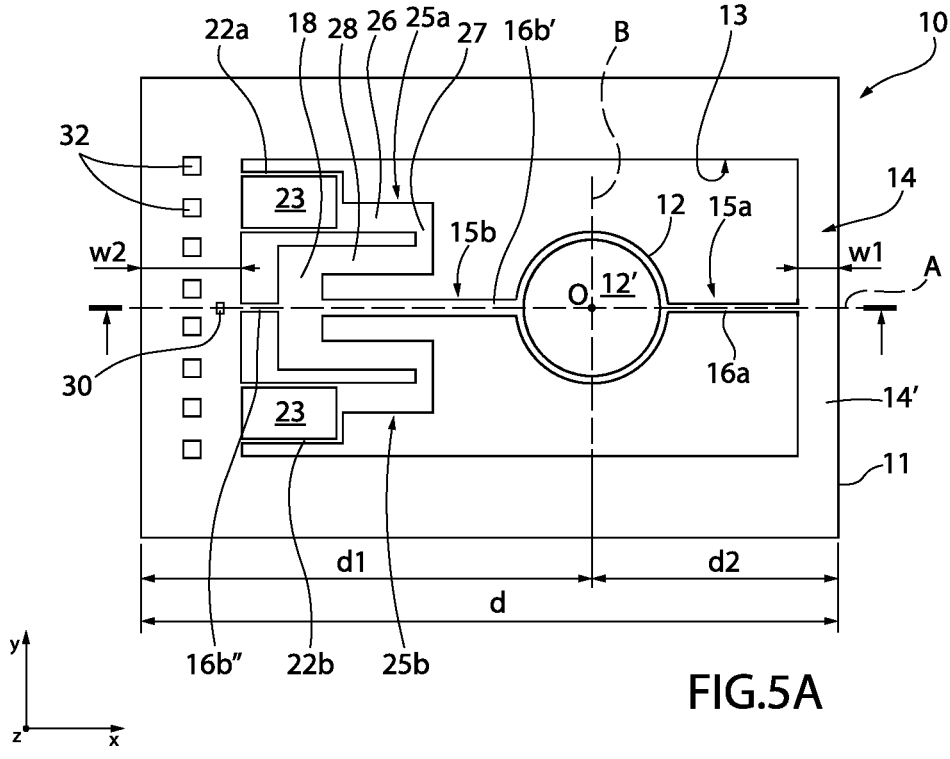
FIGS. 5A and 5B schematically show, in plan view and, respectively, in a sectional view, a tiltable mirror structure, according to a further aspect of this disclosure.
Figure 5B:
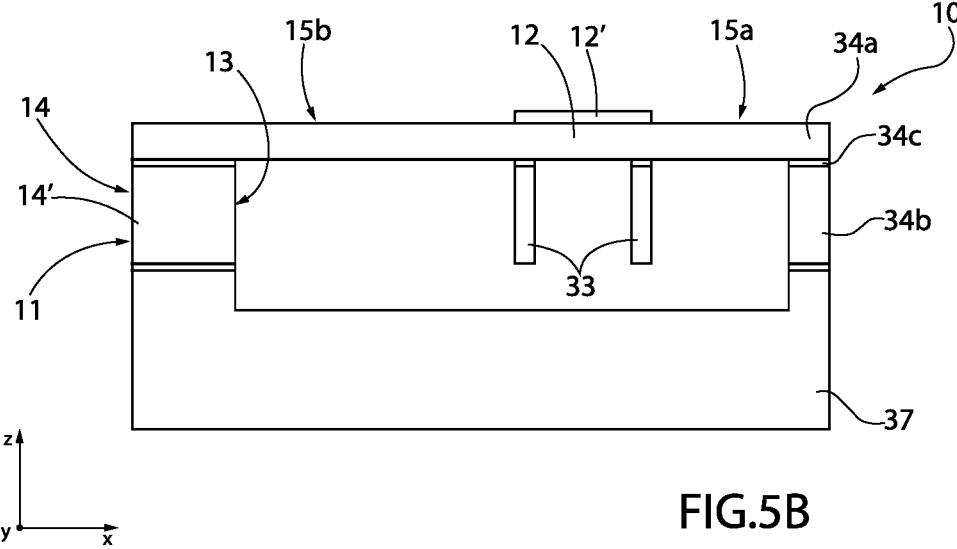

FIGS. 5A and 5B schematically show a different embodiment of the tiltable mirror structure 10, which envisages, coupled below the tiltable element 12, the presence of a reinforcement structure 33, acting as a mechanical reinforcement for the same tiltable element 12 (and also for ensuring the flatness thereof, in the horizontal plane xy, in a rest condition); this reinforcement structure 33 may have, for example, a ring shape and be arranged at the periphery of the tiltable element 12 (the reinforcement structure 33 is essentially formed on the back of the die 11).

In particular, in the embodiment shown in FIG. 5B, the die 11 is of a SOI (Silicon on Insulator) type, with the tiltable element 12 and the first and the second coupling structures 15*a*, 15*b* provided in an active layer 34*a* of the die 11 and the aforementioned reinforcement structure 33 provided in a support layer 34*b* of the same die 11. In this case, the aforementioned frame 14' is provided in both the active and support layers 34*a*, 34*b* of the die 11 and also in a corresponding insulating layer 34*c*, interposed between the same active and support layers 34*a*, 34*b*.

A support wafer 37, coupled for example by bonding, is also present below the die 11.

In this embodiment, owing to the presence of the aforementioned reinforcement structure 33, it is possible to further reduce the size of the tiltable mirror structure 10, in particular to reduce the length of the first coupling structure 15*a* and of the corresponding torsional spring 16*a* (i.e., the first extension dimension d1), while maintaining a same operating frequency.

In the illustrated example, the aforementioned first extension dimension d1 of the tiltable mirror structure 10 is for example equal to 2.5 mm and the aforementioned second extension dimension d2 is equal to 4 mm (with the total extension d equal to 6.5 mm), with a same optical performance (in particular, a same opening angle) of the structure described with reference to FIG. 3.

In this embodiment, the frame 14' may also be provided in a further asymmetrical manner, having the aforementioned first and second short sides (i.e., the portions on the opposite sides of the aforementioned second axis B directed along the second horizontal axis y) having a different width along the first horizontal axis x. In particular, the side portion coupled to the first coupling structure 15*a* (the aforementioned first short side) has in this case a width w1 smaller with respect to a width w2 of the side portion coupled to the second coupling structure 15*b* (the aforementioned second short side).

Figures 6A, 6B, 6C:
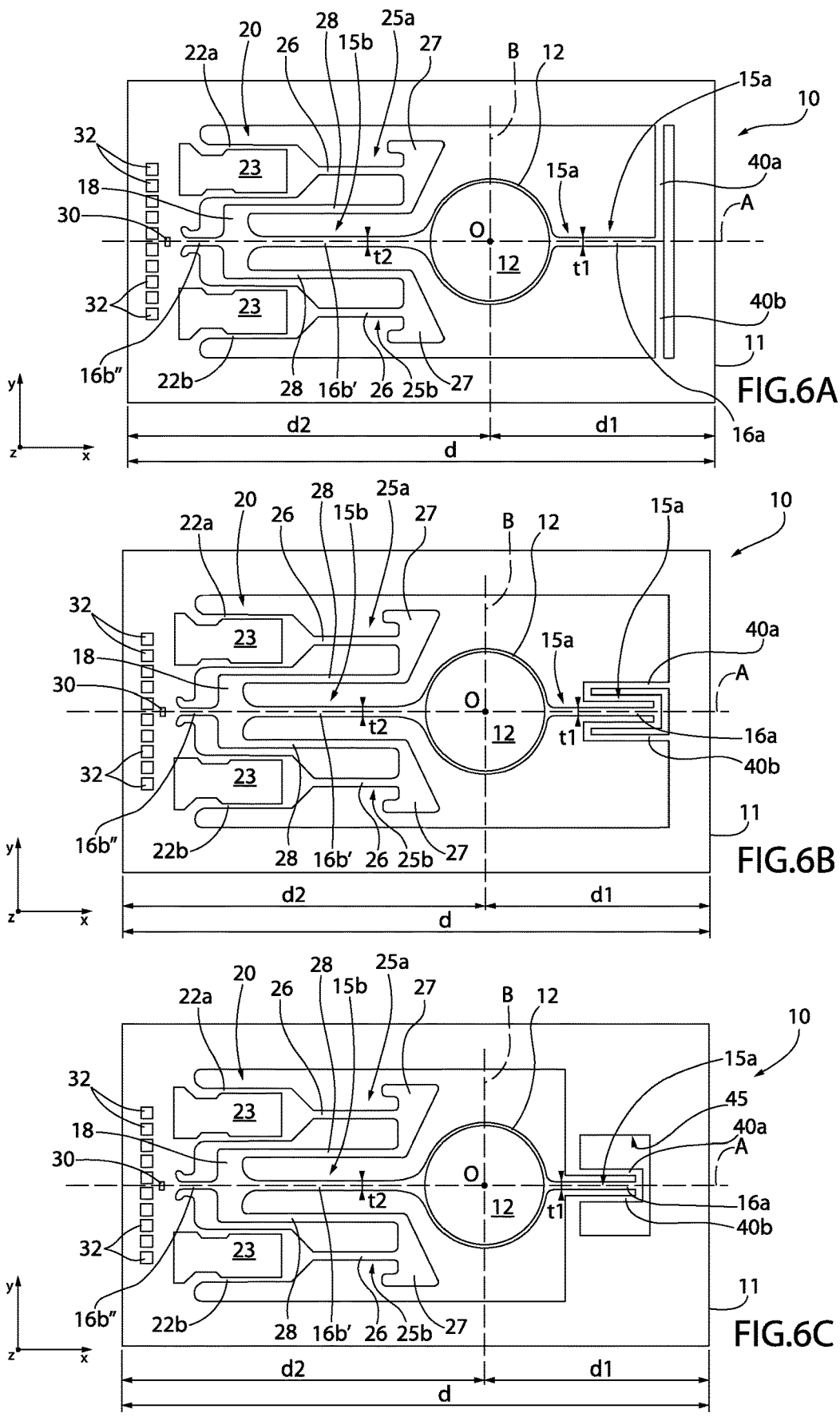
FIGS. 6A-6C show schematic plan views of further variants of the tiltable mirror structure, according to an aspect of this disclosure.

With reference to FIGS. 6A-6C further variant embodiments of the tiltable mirror structure 10 are now illustrated, aimed at reducing the size of the same tiltable mirror structure 10 and the corresponding area occupation.

In particular, in the embodiment illustrated in FIG. 6A, the second end of the single torsional spring 16*a* of the first coupling structure 15*a* is not directly coupled to the frame 14'. Conversely, this second end is coupled to the aforementioned frame 14' by first and second coupling elastic elements 40*a*, 40*b*, of a linear type, having extension parallel to the second horizontal axis y, transversely to the same torsional spring 16*a*, from the aforementioned second end towards a respective long side of the frame 14' (it should be noted that in this case, the aforementioned torsional spring 16*a* is therefore not coupled to the first short side of the same frame 14').

Advantageously, this variant embodiment allows the length of the torsional spring 16*a* of the first coupling structure 15*a* to be reduced.

In the variant embodiment illustrated in FIG. 6B, the aforementioned first and second coupling elastic elements 40*a*, 40*b* are of a folded type and have general extension along the first horizontal axis x, coupling the aforementioned second end of the torsional spring 16*a* of the first coupling structure 15*a*, again to the first short side of the frame 14'.

Owing to the folded configuration of the same first and second coupling elastic elements 40*a*, 40*b* it is possible to obtain an even greater reduction of the first extension dimension d1 of the tiltable mirror structure 10, on the first side of the second axis B; in general, the space occupation of the die is optimized.

In the variant embodiment of FIG. 6C, the aforementioned first and second coupling elastic elements 40*a*, 40*b*, again having a folded-type configuration, and furthermore most of the torsional spring 16*a* of the first coupling structure 15*a* extend inside a recess 45 provided in the frame 14' at the corresponding first short side. In this manner, it is possible to obtain an even greater reduction of the first extension dimension d1 of the tiltable mirror structure 10, on the first side of the second axis B.

Figure 2:
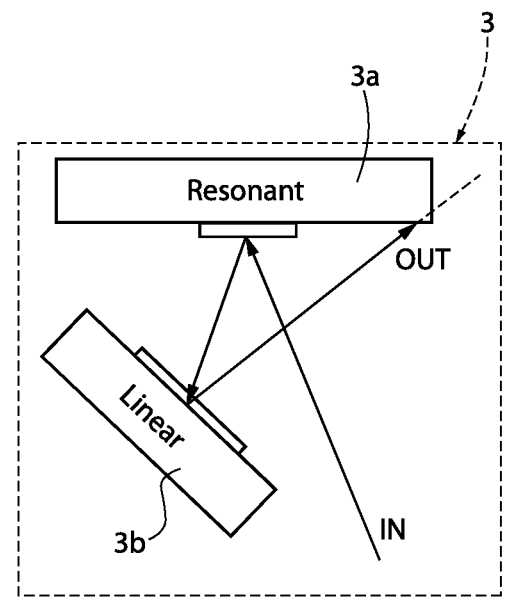
FIG. 2 schematically shows a prior art microelectromechanical mirror device with biaxial projection, with a possible arrangement of corresponding tiltable mirror structures.

As previously discussed, the tiltable mirror structure 10 may be used as a first tiltable mirror structure 3*a* (see the aforementioned FIGS. 1 and 2), driven in resonance to generate a fast scan, in a microelectromechanical mirror device 3 (defining for example a mirror module with biaxial projection of a picoprojector), further comprising a second tiltable mirror structure 3*b*, controlled so as to rotate around a respective rotation axis with linear or quasi-static movement, to generate a slow scan.

The size reduction obtained, as discussed in detail, for the first tiltable mirror structure 3*a* helps reducing the general volume occupation of the microelectromechanical mirror device 3.

However, it has been realized that, for the purposes of this volume reduction, optimizing the size of the second tiltable mirror structure 3*b* as well and also providing for an optimized joint arrangement of the same first and second tiltable mirror structures 3*a*, 3*b*, is recommended.

A further aspect of this disclosure therefore provides, in a microelectromechanical mirror device 3 with biaxial projection, comprising the tiltable mirror structure 10 previously described (acting as a first tiltable mirror structure 3*a*), for optimization of the size and arrangement of the associated second tiltable mirror structure 3*b*.

As will be discussed in detail below, this aspect of this disclosure envisages a suitable patterning of a die wherein the second tiltable mirror structure 3*b* is formed, aimed not only at reducing the size, but also at facilitating a mutual positioning with the first tiltable mirror structure 3*a*.

Figure 7A:
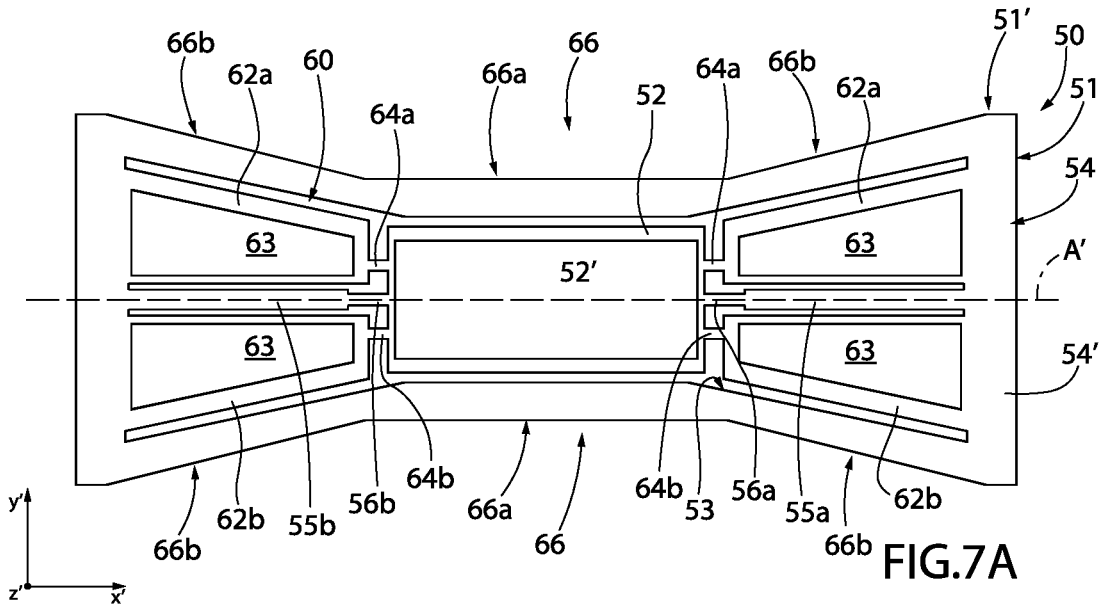
FIGS. 7A and 7B show schematic plan views of respective variants of a further tiltable mirror structure of the microelectromechanical mirror device, having a linear or quasi-static movement, according to an aspect of this disclosure.

Referring now to FIG. 7A, an embodiment of a tiltable mirror structure 50 is described, which may be employed as the aforementioned second tiltable mirror structure 3*b* in the microelectromechanical mirror device 3.

In general, this tiltable mirror structure 50 is for example provided as described in detail in United States Patent Publication No. 2020/0192199 (corresponding to European patent application EP366672A1) which is incorporated herein by reference.

The tiltable mirror structure 50 has a completely symmetrical shape with respect to a first x' and a second y' horizontal axis of a respective horizontal plane x'y' and is made in a respective die 51 of semiconductor material, in particular silicon.

The tiltable mirror structure 50 is provided with a respective tiltable element 52, which is arranged so that it rotates (with a quasi-static movement) around a respective rotation axis A' (parallel to the first horizontal axis x') and carries a reflecting surface 52'. In the example illustrated, the tiltable element 52 has a rectangular shape in the horizontal plane x'y', elongated along the respective rotation axis A'.

In particular, the die 51 comprises a fixed structure 54 defining a frame 54' which delimits and surrounds a cavity 53 wherein the tiltable element 52 is accommodated; first and second support (or anchoring) elements 55*a*, 55*b*, integral with the frame 54', extend from the same frame 54', inside the cavity 53 along the aforementioned respective rotation axis A', on opposite sides with respect to the tiltable element 52.

The tiltable element 52 is elastically coupled to the first and the second support elements 55*a*, 55*b* by first and second suspension elastic elements 56a, 56b, having a high stiffness with respect to movements outside the horizontal plane and yielding with respect to torsion around the respective rotation axis A'. These first and second suspension elastic elements 56a, 56b also extend along the respective rotation axis A', as an extension of the first, respectively the second, support elements 55a, 55b.

The tiltable mirror structure 50 further comprises an actuation structure 60, coupled to the tiltable element 52 and configured to causes its rotation around the respective rotation axis A; the actuation structure 60 is interposed between the tiltable element 52 and the fixed structure 54 and contributes to supporting the tiltable element 52 above the cavity 53.

This actuation structure 60 comprises first and second pairs of driving arms, each formed by first and second driving arms 62a, 62b, arranged on opposite sides of, and symmetrically with respect to, the respective rotation axis A' and a respective one of the first and the second support elements 55a, 55b.

Each driving arm 62a, 62b is suspended above the cavity 53 and carries a respective piezoelectric structure 63 (in particular including PZT); each driving arm 62a, 62b has a first end integrally coupled to the frame 54' and a second end elastically coupled to the tiltable element 52 by a respective decoupling elastic element 64a, 64b, in the example of linear type (having a high stiffness with respect to movements outside the horizontal plane and yielding with respect to torsion).

According to a particular aspect of this disclosure, the frame 54' of the die 51, which defines an outer side surface 51' of the same die 51 has, at its longitudinal extension, parallel to the respective rotation axis A', a suitably patterned shape. In other words, the aforementioned frame 54' does not have, in the horizontal plane x'y', a rectangular or square profile.

In particular, this outer side surface 51' is patterned in a concave manner, so that it defines, on both sides of the tiltable element 52 with respect to the first horizontal axis x', a respective recess 66.

In the embodiment illustrated in the aforementioned FIG. 7A, each recess 66 has a basin shape and is delimited by: a base portion 66a extending along the first horizontal axis x', externally to the tiltable element 52; and by wall portions 66b, inclined (in a 'V' pattern) with respect to the base portion 66a.

Figure 7B:
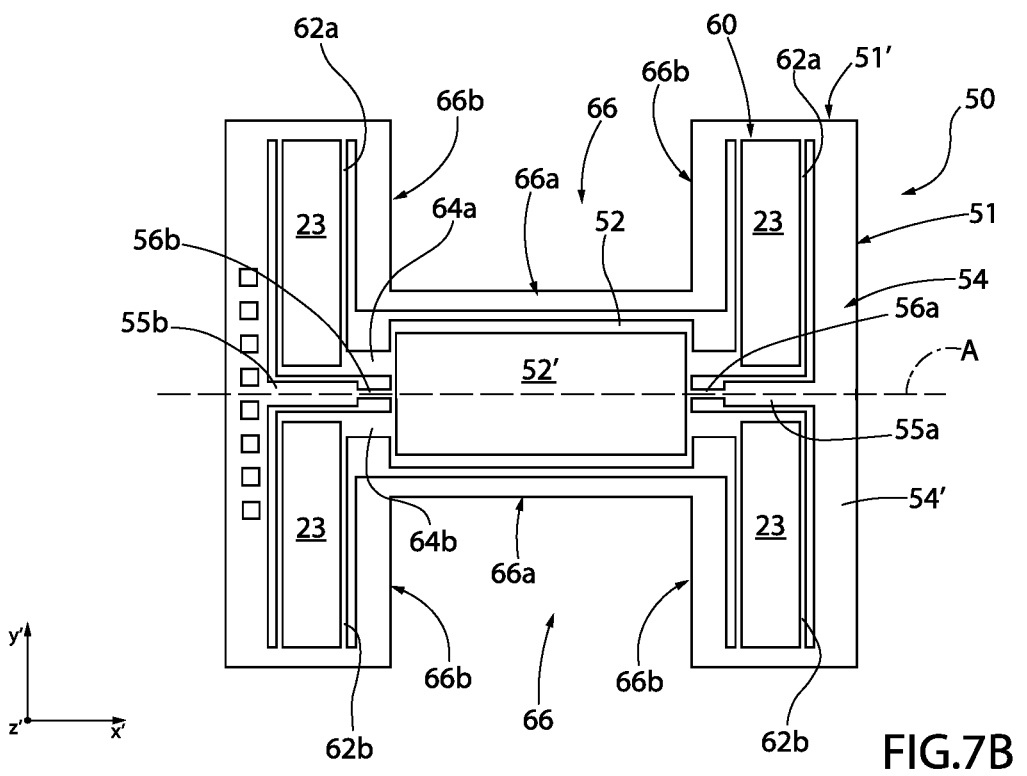

In the different embodiment illustrated in FIG. 7B, the same recess 66 has instead, in the horizontal plane x'y', a 'U' shape, with the base portion 66a extending along the first horizontal axis x' and the wall portions 66b in this case extending orthogonally along the second horizontal axis y'.

In both embodiments, the outer side surface 51' is arranged in a very close position, with a small or minimum separation gap, with respect to the driving arms 62a, 62b and to the tiltable element 52, through an entire extension along the first horizontal axis x', so as to optimize the area occupation in the horizontal plane x'y'.

In other words, the tiltable mirror structure 50 thereby minimizes the extension of non-active areas (i.e., the empty spaces not having a specific function in the same structure).

It should be noted that in the embodiment illustrated in FIG. 7B, the aforementioned driving arms 62a, 62b extend along the second horizontal axis y' (instead of along the first horizontal axis x'), giving the tiltable mirror structure 50 an overall 'H' shape in the horizontal plane x'y'.

Figure 8A:
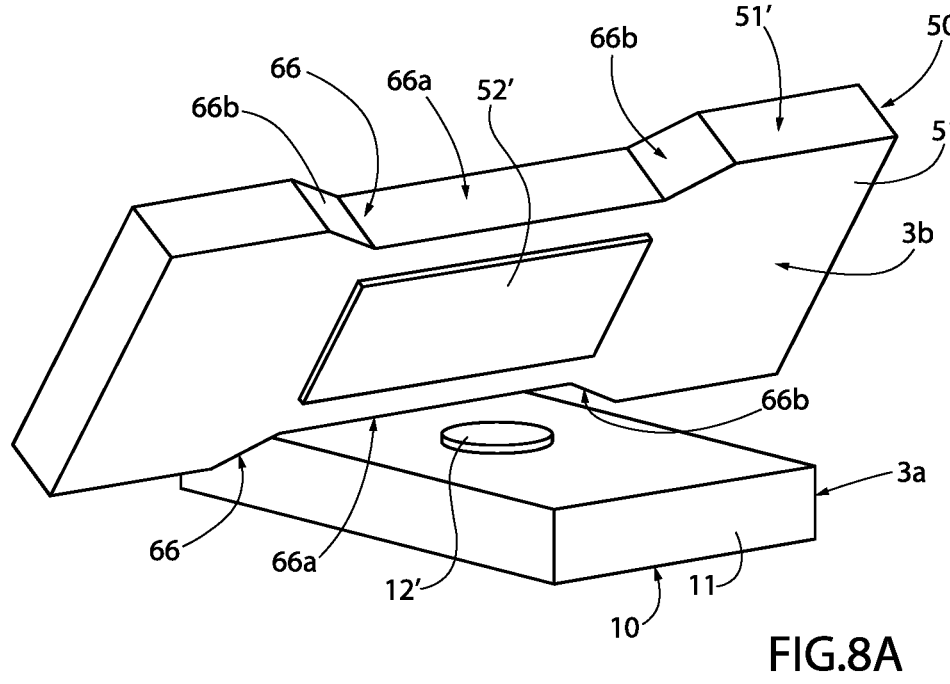
FIGS. 8A-8B schematically show possible combined arrangements of the tiltable mirror structures of the microelectromechanical mirror device, according to an aspect of this disclosure.
Figure 8B:
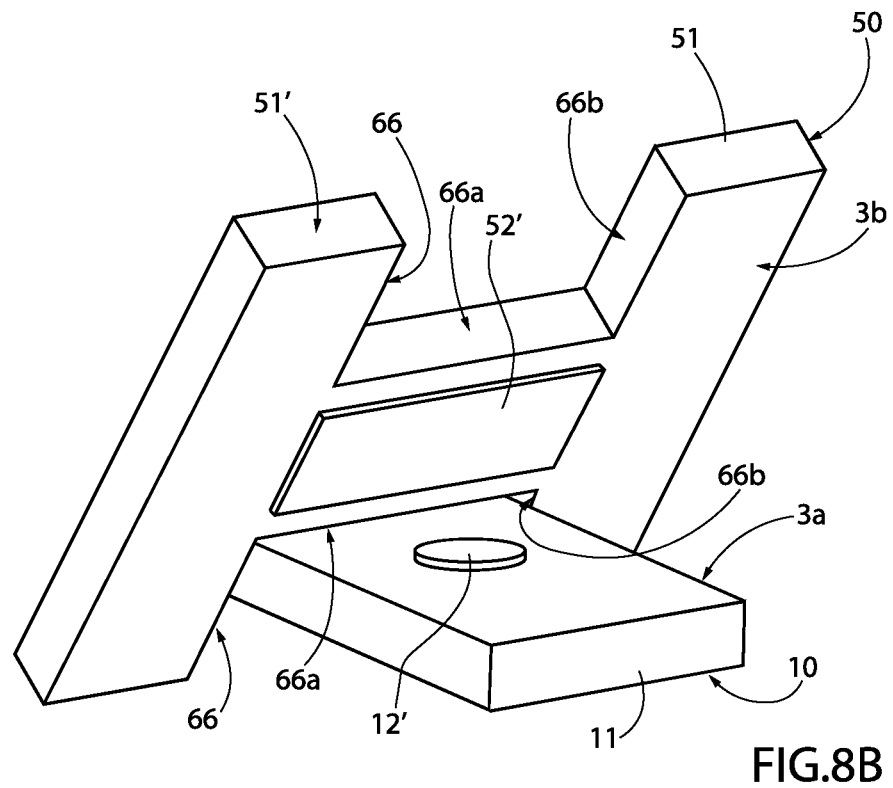

As schematically illustrated in FIG. 8A (relative to the embodiment of FIG. 7A) and in FIG. 8B (relative to the embodiment of FIG. 7B), according to a particular aspect of this disclosure, assembling of the microelectromechanical mirror device 3 provides that the first tiltable mirror structure 3a (i.e., the aforementioned tiltable mirror structure 10) is accommodated at least in part in the recess 66 of the tiltable mirror structure 50 (which provides, as previously indicated, the second tiltable mirror structure 3b), so as to optimize the total volume occupation and also obtain a very close arrangement between the same first and second tiltable mirror structures 3a, 3b.

In particular, the second tiltable mirror structure 3b is arranged with the respective horizontal plane x'y' at a certain angle (lower than 90°) with respect to the horizontal plane xy of the first tiltable mirror structure 3a.

In this manner it is possible to obtain a very compact final assembly and also to reduce the size of the first and the second tiltable mirror structures 3a, 3b with the same optical requirements (for example in terms of an opening angle) for the same first and second tiltable mirror structures 3a, 3b.

From the manufacturing point of view, manufacturing of the die 51 of the tiltable mirror structure 50, given the patterning of the corresponding outer side surface 51', entails defining, on the wafers of semiconductor material, scribing lines that are not parallel. To this end, stealth dicing technique may be used and/or "dummy" structures (non-functional) may be provided between the dies 51 before dicing.

Figures 9, 10:
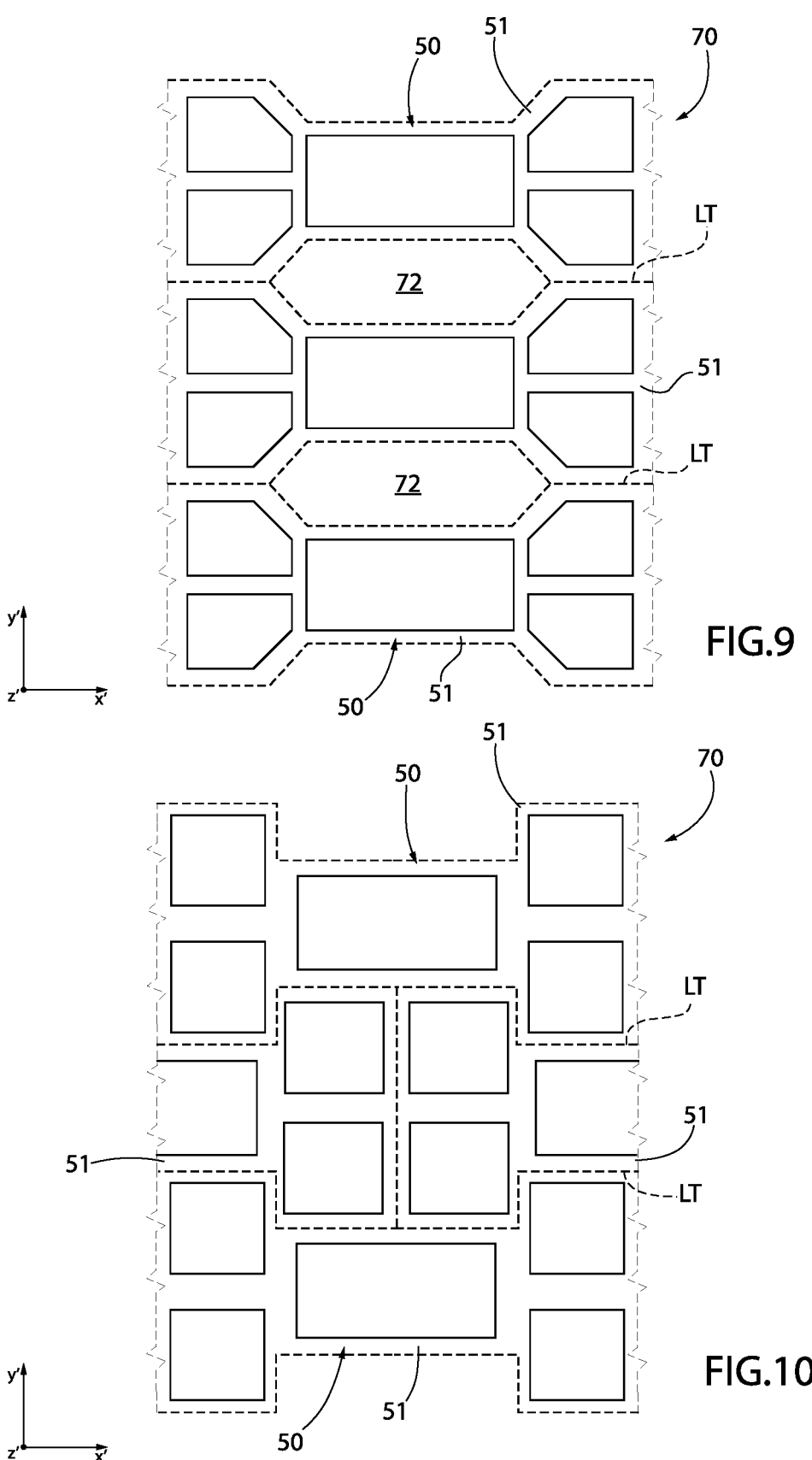
FIGS. 9 and 10 show schematic views of the layout of a semiconductor material wafer wherein the tiltable mirror structures are provided, according to an aspect of this disclosure.

By way of example, FIG. 9 shows a portion of a wafer 70 of semiconductor material, in particular silicon, wherein a plurality of dies 51 have been provided, each integrating a corresponding tiltable mirror structure 50 (according to the embodiment previously discussed with reference to FIG. 7A). In addition to the scribing lines, indicated by LT, being non-parallel, dummy dies are highlighted, indicated by 72, interposed between the dies 51, in this case along the second horizontal axis y'.

In order to optimize the manufacturing costs, alternative arrangements of the dies 51 in the wafer 70 may be provided, which do not require the presence of the aforementioned dummy dies 72.

By way of example, FIG. 10 shows a respective wafer 70 of semiconductor material, in particular silicon, wherein a plurality of dies 51 have been provided, each integrating a corresponding tiltable mirror structure 50 (this time according to the embodiment previously discussed with reference to FIG. 7B). In addition to the scribing lines, indicated by LT, non-parallel, in this case the absence of the aforementioned dummy dies 72 is highlighted, given the contiguous and adjacent arrangement of dies 51.

Figure 11:
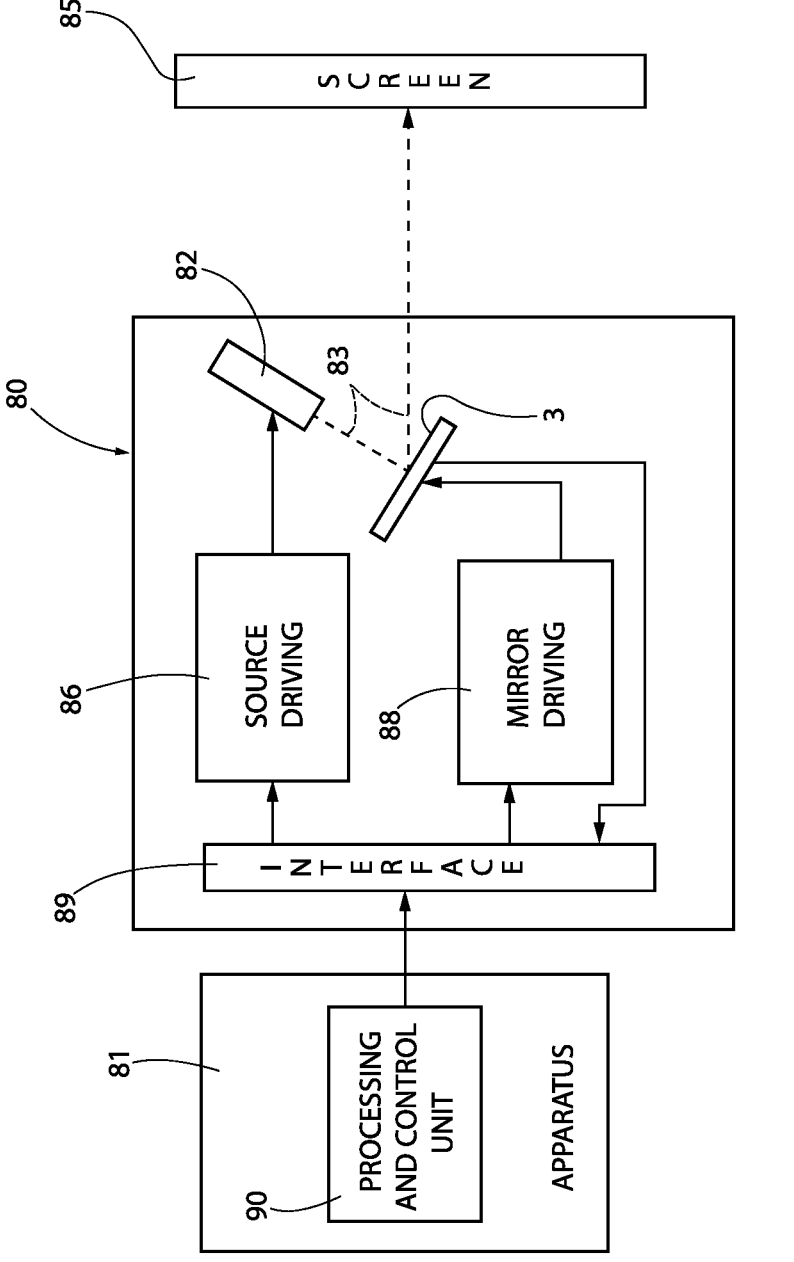
FIG. 11 is a schematic block diagram of an optoelectronic apparatus, for example a picoprojector, using the microelectronic mirror device disclosed herein.

As schematically illustrated in FIG. 11, the microelectromechanical mirror device 3 may be advantageously used in an optoelectronic device, such as a picoprojector, 80, for example to be functionally coupled to a portable electronic apparatus 81 (such as a smartphone or augmented or virtual reality glasses or headset).

In detail, the optoelectronic device 80 comprises a light source 82, for example of a laser type, for generating a light beam 83; the microelectromechanical mirror device 3, acting as a mirror module with biaxial projection and for receiving the light beam 83 and directing it towards a screen or display surface 85 (external and placed at a distance from the same optoelectronic device 80); a first driving circuit 86, for providing suitable control signals to the light source 82, for generation of the light beam 83, as a function of an image to be projected; a second driving circuit 88, for providing suitable control signals to the actuation structure of the microelectronic mirror device 3; and an interface 89, for receiving, from a control unit 90, in this case being external, for example included in the portable electronic apparatus 81, first control signals to control the first driving circuit 86, and second control signals to control the second driving circuit 88.

The control unit 90 also receives, through the interface 89, a feedback signal, provided by the microelectromechanical mirror device 3, for a feedback control of the driving of the same tiltable structure 2.

The advantages are clear from the preceding description.

In any case, it is again highlighted that the described asymmetrical embodiment of the tiltable mirror structure 10 (3a) allows obtaining a reduced area occupation of the same tiltable mirror structure 10, in particular a reduction of the aforementioned first extension dimension d1 on the first side of the second axis B.

This embodiment therefore allows avoiding clipping of the light projection, due to the close arrangement between the tiltable mirror structures 3a, 3b of a microelectromechanical mirror device 3 with biaxial projection, as described with reference to the prior art.

Furthermore, the shaping of the die 51 of the tiltable mirror structure 50 (3b) and the resulting assembly with optimized volume occupation of the resulting microelectromechanical mirror device 3 (owing to the close arrangement of the tiltable mirror structures 3a, 3b) is also advantageous.

In general, this disclosure allows exploiting the advantages of the piezoelectric actuation (i.e., the use of reduced biasing voltages with a reduced energy consumption to obtain high displacements) and of the mirror actuation piezoresistive sensing, while having improved mechanical and electrical performance with respect to known solutions.

Finally, it is clear that modifications and variations may be made to what has been described and illustrated without thereby departing from the scope of the present invention, as defined in the attached claims.

For example, it is highlighted that the described asymmetrical embodiment of the tiltable mirror structure 10 may also find advantageous application for different configurations of the same tiltable mirror structure 10, for example in case of structures having quasi-static movement, therefore intended to provide a slow scan, for example a sawtooth scan, onto a corresponding projection screen. This may, for example, be advantageous, in case the required opening angle is not high and reducing the overall space occupation of the microelectromechanical mirror device is important.

The invention claimed is:

1. An electronic device including a microelectromechanical mirror device, the microelectromechanical mirror device comprising a first tiltable mirror structure provided in a first die of semiconductor material having a main extension in a horizontal plane defined by first and second horizontal axes, wherein said first tiltable mirror structure comprises:
   a fixed structure defining a frame which delimits a cavity;
   a tiltable element carrying a reflecting region, elastically suspended above the cavity and having first and second median axes of symmetry, respectively parallel to said first and second horizontal axes, said tiltable element being elastically coupled to said frame by first and second coupling structures on opposite sides of said second horizontal axis; and
   a driving structure coupled to the tiltable element and configured to cause it to rotate around the first horizontal axis with a resonance movement;
   wherein said first tiltable mirror structure is asymmetrical with respect to the second horizontal axis and has, along the first horizontal axis:

a first extension dimension on a first side of said second horizontal axis; and
   a second extension dimension, greater than the first extension dimension, on a second side of said second horizontal axis opposite to the first side;
      wherein said first coupling structure is arranged on the first side of the second horizontal axis and comprises a single torsional spring coupled between the tiltable element and the frame; and
      wherein the second coupling structure is coupled between the tiltable element and the frame, and comprises a first torsional spring, a second torsional spring, and a constraint element interposed between said first and second torsional springs, the constraint element being extending for a greater length along the second horizontal axis than the first horizontal axis.

2. The electronic device according to claim 1, wherein said first tiltable mirror structure further comprises a reinforcement structure coupled below the tiltable element as a mechanical reinforcement for said tiltable element.

3. The electronic device according to claim 1, wherein the electronic device is an optoelectronic device including a light source for generating a light beam, with the microelectromechanical mirror device acting as a mirror module with biaxial projection for receiving the light beam and directing it towards an external screen or display surface placed at a distance from the optoelectronic device.

4. An electronic device including a microelectromechanical mirror device, the microelectromechanical mirror device comprising a first tiltable mirror structure provided in a first die of semiconductor material having a main extension in a horizontal plane defined by first and second horizontal axes, wherein said first tiltable mirror structure comprises:
   a fixed structure defining a frame which delimits a cavity;
   a tiltable element carrying a reflecting region, elastically suspended above the cavity and having first and second median axes of symmetry, respectively parallel to said first and second horizontal axes, said tiltable element being elastically coupled to said frame by first and second coupling structures on opposite sides of said second horizontal axis; and
   a driving structure coupled to the tiltable element and configured to cause it to rotate around the first horizontal axis with a resonance movement;
   wherein said first tiltable mirror structure is asymmetrical with respect to the second horizontal axis and has, along the first horizontal axis:
   a first extension dimension on a first side of said second horizontal axis; and
   a second extension dimension, greater than the first extension dimension, on a second side of said second horizontal axis opposite to the first side;
   wherein said first coupling structure is arranged on the first side of the second horizontal axis and comprises a single torsional spring having a first end coupled to the tiltable element and a second end coupled to the frame and having linear extension along the first horizontal axis; and
   wherein the second coupling structure comprises a first torsional spring and a second torsional spring having extension along the first horizontal axis, and a constraint element interposed between said first and second torsional springs, said first torsional spring having a first end coupled to the tiltable element and a second end coupled to the constraint element and said second torsional spring having a first end coupled to the constraint element on opposite side with respect to the first torsional spring along the first horizontal axis and a second end coupled to the frame.

5. The electronic device according to claim 4, wherein said single torsional spring of the first coupling structure has a first width along the second horizontal axis, which is smaller than a corresponding second width of the first torsional spring of the second coupling structure.

6. The electronic device according to claim 4, wherein said single torsional spring of the first coupling structure has a first torsional stiffness and said first torsional spring of the second coupling structure has a second torsional stiffness; and wherein a ratio between said first and second torsional stiffnesses is comprised between 0.55 and 0.65.

7. The electronic device according to claim 4, wherein said driving structure is entirely arranged on said second side of the second horizontal axis, on a same side as the second coupling structure.

8. The electronic device according to claim 7, wherein said driving structure comprises a single pair of driving arms coupled to the tiltable element formed by first and second driving arms arranged on opposite sides of, and symmetrically with respect to, the first horizontal axis and the second coupling structure; wherein said first and second driving arms each have a first end integrally coupled to the frame of the fixed structure, are suspended above the cavity and carry, at respective top surfaces, opposite to the cavity, respective piezoelectric structures.

9. The electronic device according to claim 8, wherein said driving structure further comprises first and second displacement transfer structures arranged symmetrically to each other with respect to the first horizontal axis and interposed between a second end of the first and the second driving arms and respective end portions of the constraint element of the second coupling structure; each displacement transfer structure being configured to convey driving of the first or second driving arm to the respective end portion of the constraint element.

10. The electronic device according to claim 9, wherein each of the first and second displacement transfer structures comprises a first arm having linear extension along the first horizontal axis and coupled between the second end of a corresponding driving arm and a rigid connecting element, arranged in proximity to the tiltable element; and a second arm having linear extension along the first horizontal axis parallel to the first arm and coupled between the rigid connecting element, in proximity to the tiltable element, and the respective end portion of the constraint element of the second coupling structure.

11. The electronic device according to claim 4, wherein the second end of the single torsional spring of the first coupling structure is coupled to said frame by first and second coupling elastic elements of a linear type, having extension parallel to the second horizontal axis, transversely to the single torsional spring, from the second end towards a respective long side of the frame.

12. The electronic device according to claim 4, wherein the second end of the single torsional spring of the first coupling structure is coupled to said frame by first and second coupling elastic elements; and wherein said first and second coupling elastic elements are of a folded type and have general extension along the first horizontal axis coupling said second end of the single torsional spring to a first short side of the frame.

13. The electronic device according to claim 12, wherein said first and second coupling elastic elements and part of the single torsional spring extend inside a recess provided in the frame at said first short side.

14. The electronic device according to claim 4, wherein said first tiltable mirror structure further comprises a reinforcement structure coupled below the tiltable element as a mechanical reinforcement for said tiltable element.

15. The electronic device according to claim 4, wherein the electronic device is an optoelectronic device including a light source for generating a light beam, with the microelectromechanical mirror device acting as a mirror module with biaxial projection for receiving the light beam and directing it towards an external screen or display surface placed at a distance from the optoelectronic device.

16. An electronic device including a microelectromechanical mirror device, the microelectromechanical mirror device comprising a first tiltable mirror structure provided in a first die of semiconductor material having a main extension in a horizontal plane defined by first and second horizontal axes, wherein said first tiltable mirror structure comprises:

a fixed structure defining a frame which delimits a cavity;
a tiltable element carrying a reflecting region, elastically suspended above the cavity and having first and second median axes of symmetry, respectively parallel to said first and second horizontal axes, said tiltable element being elastically coupled to said frame by first and second coupling structures, on opposite sides of said second horizontal axis; and
a driving structure coupled to the tiltable element and configured to cause it to rotate around the first horizontal axis with a resonance movement;
wherein said first tiltable mirror structure is asymmetrical with respect to the second horizontal axis and has, along the first horizontal axis:
a first extension dimension on a first side of said second horizontal axis; and
a second extension dimension, greater than the first extension dimension, on a second side of said second horizontal axis opposite to the first side;
a second tiltable mirror structure provided with a tiltable element, configured to rotate around a rotation axis with linear or quasi-static movement and arranged to cooperate with the tiltable element of said first tiltable mirror structure for directing an impinging light beam;
wherein said second tiltable mirror structure is provided in a second die of semiconductor material having a main extension in a horizontal plane defined by first and second horizontal axes and having a fixed structure defining a frame which delimits a cavity wherein the tiltable element is arranged;
said frame defining an outer side surface of the second die having a concavely patterned shape to define a recess which accommodates at least in part the first die of said first tiltable mirror structure.

17. The electronic device according to claim 16, wherein the second tiltable mirror structure is arranged with the horizontal plane arranged at a certain angle, lower than 90°, with respect to the horizontal plane of the first tiltable mirror structure.

18. The electronic device according to claim 16, wherein said recess has a basin shape and is delimited by a base portion extending parallel to said first horizontal axis and by wall portions, inclined, or orthogonal, with respect to the base portion.

19. The electronic device according to claim 16, wherein said second tiltable mirror structure further comprises an actuation structure coupled to the tiltable element and configured to cause it to rotate around the rotation axis; the actuation structure comprising first and second pairs of driving arms, each formed by first and second driving arms, arranged on opposite sides of, and symmetrically with respect to, the rotation axis, each having a first end integrally coupled to the frame and a second end elastically coupled to the tiltable element by a respective decoupling elastic element; wherein the outer side surface is arranged in a close position, with a reduced separation gap, with respect to the driving arms and the tiltable element throughout an entire extension along the first horizontal axis.

20. The electronic device according to claim 16, wherein said first tiltable mirror structure further comprises a reinforcement structure coupled below the tiltable element as a mechanical reinforcement for said tiltable element.

21. The electronic device according to claim 16, wherein the electronic device is an optoelectronic device including a light source for generating a light beam, with the microelectromechanical mirror device acting as a mirror module with biaxial projection for receiving the light beam and directing it towards an external screen or display surface placed at a distance from the optoelectronic device.

22. An electronic device comprising a microelectromechanical mirror device with a first tiltable mirror structure in a first semiconductor material die, extending in a horizontal plane defined by first and second horizontal axes, wherein the first tiltable mirror structure includes:

a frame enclosing a cavity;

a tiltable, reflective element with first and second median symmetry axes parallel to the first and second horizontal axes, elastically connected to the frame by first and second coupling mechanisms on opposite sides of the second horizontal axis; and a driving mechanism linked to the tiltable, reflective element to induce rotation around the first horizontal axis using a resonant movement;

wherein the first tiltable mirror structure is asymmetrical concerning the second horizontal axis and has varying extension dimensions along the first horizontal axis;

wherein the first coupling mechanism, positioned on the first side of the second horizontal axis, comprises a single torsional spring connected to the tiltable, reflective element and the frame, extending linearly along the first horizontal axis;

wherein the second coupling mechanism includes first and second torsional springs extending along the first horizontal axis, and a constraint component between the first and second torsional springs, with the first and second torsional springs connected to the tiltable, reflective element, constraint component, and frame.

23. The electronic device according to claim 22, wherein the single torsional spring of the first coupling mechanism has a first width along the second horizontal axis, smaller than a corresponding second width of the first torsional spring of the second coupling mechanism.

24. The electronic device according to claim 22, wherein the single torsional spring of the first coupling mechanism has a first torsional stiffness and the first torsional spring of the second coupling mechanism has a second torsional stiffness; a ratio between the first and second torsional stiffnesses being between 0.55 and 0.65.

25. The electronic device according to claim 22, wherein the driving mechanism is entirely positioned on the second side of the second horizontal axis, on the same side as the second coupling mechanism.

* * * * *